(12) United States Patent
Kimura

(10) Patent No.: US 8,816,666 B2
(45) Date of Patent: Aug. 26, 2014

(54) SEMICONDUCTOR SWITCHING DEVICE DRIVE CIRCUIT USING A LIMITED DRIVE VOLTAGE

(75) Inventor: Tomonori Kimura, Obu (JP)

(73) Assignee: DENSO CORPORATION, Kariya (JP)

( * ) Notice: Subject to any disclaimer, the term of this patent is extended or adjusted under 35 U.S.C. 154(b) by 265 days.

(21) Appl. No.: 13/371,894

(22) Filed: Feb. 13, 2012

(65) Prior Publication Data

US 2012/0206171 A1 Aug. 16, 2012

(30) Foreign Application Priority Data

Feb. 15, 2011 (JP) .................................. 2011-29733

(51) Int. Cl.
*H01H 9/54* (2006.01)
*H01H 33/59* (2006.01)
*H01H 47/00* (2006.01)
*H01H 85/46* (2006.01)
*H01H 3/26* (2006.01)

(52) U.S. Cl.
USPC ............................. 323/289; 307/140; 327/109

(58) Field of Classification Search
USPC ................... 307/140; 323/289; 327/108, 109; 363/17, 21.02, 21.03, 65, 98
See application file for complete search history.

(56) References Cited

U.S. PATENT DOCUMENTS

| | | | | |
|---|---|---|---|---|
| 5,304,863 A * | 4/1994 | Cargille | ......................... | 327/110 |
| 6,180,959 B1 | 1/2001 | Iwasaki et al. | | |
| 6,777,827 B1 * | 8/2004 | Klemt et al. | .................. | 307/125 |
| 2002/0175719 A1 * | 11/2002 | Cohen | ........................... | 327/108 |
| 2003/0164721 A1 * | 9/2003 | Reichard | ....................... | 327/108 |
| 2004/0075486 A1 | 4/2004 | Takehara | | |
| 2005/0001659 A1 | 1/2005 | Inoshita | | |
| 2007/0195556 A1 | 8/2007 | Nakamura et al. | | |
| 2008/0122497 A1 | 5/2008 | Ishikawa et al. | | |
| 2009/0109710 A1 * | 4/2009 | Nakahori | ........................ | 363/17 |
| 2010/0295523 A1 | 11/2010 | Grbovic | | |

FOREIGN PATENT DOCUMENTS

| | | |
|---|---|---|
| JP | A-2004-194450 | 7/2004 |
| JP | B2-3572400 | 7/2004 |
| JP | A-2005-12972 | 1/2005 |
| JP | B2-3731562 | 10/2005 |
| JP | A-2010-35387 | 2/2010 |

OTHER PUBLICATIONS

U.S. Appl. No. 13/371,858, filed Feb. 13, 2012, Kimura et al.
U.S. Appl. No. 13/371,773, filed Feb. 13, 2013, Kimura.

* cited by examiner

*Primary Examiner* — Adolf Berhane
*Assistant Examiner* — Gary Nash
(74) *Attorney, Agent, or Firm* — Posz Law Group, PLC

(57) ABSTRACT

One of first and second switching devices turns on to flow a current along a current path between a potential reference output terminal of a drive-target switching device and a control terminal of the drive-target switching device to turn on the drive-target switching device. Thereby, a voltage changes between the control terminal of the drive-target switching device and the potential reference output terminal of the drive-target switching device to turn off the one of the first and second switching devices being turned on. Thereby, a potential of the control terminal of the drive-target switching device is clamped.

8 Claims, 9 Drawing Sheets

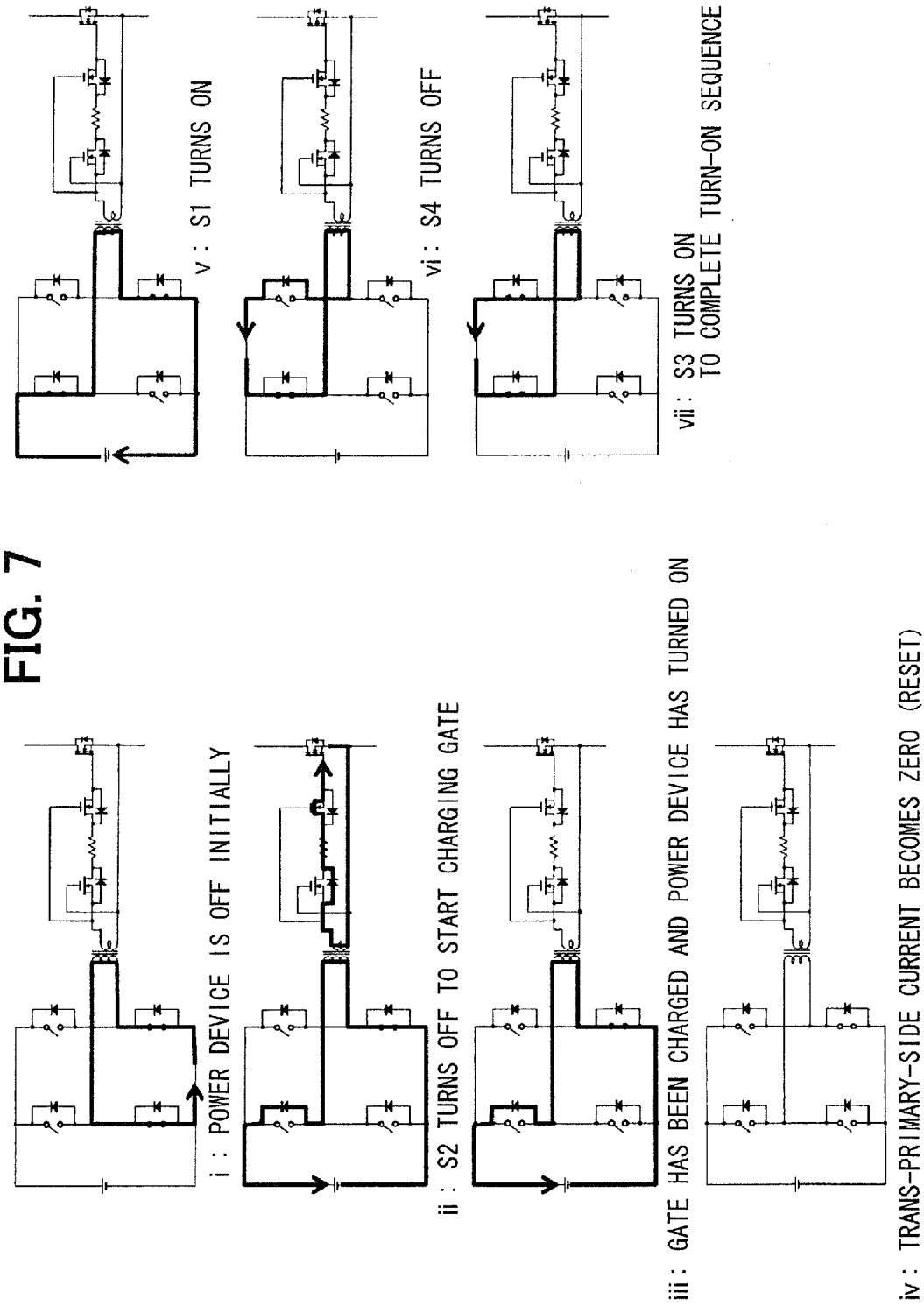

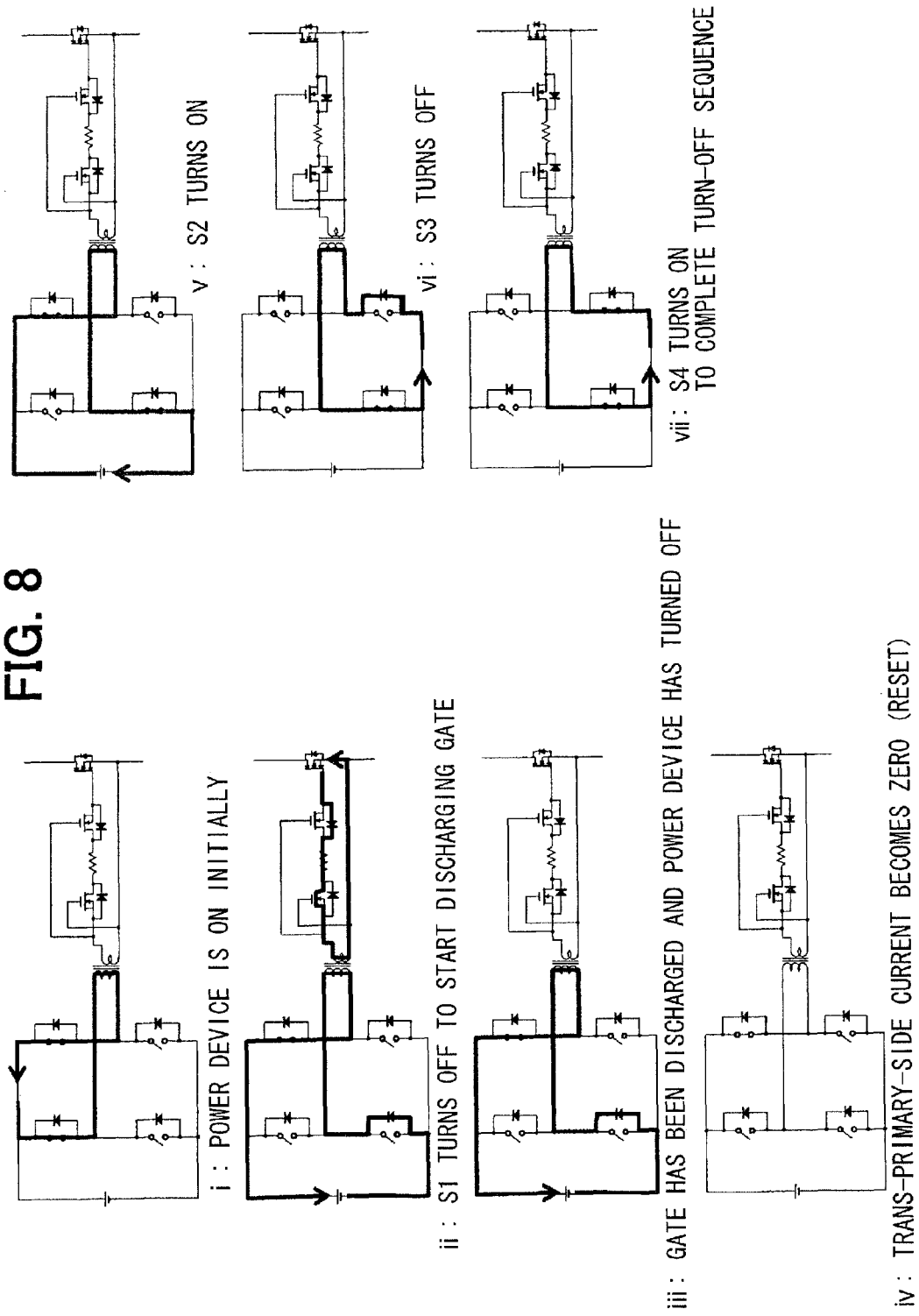

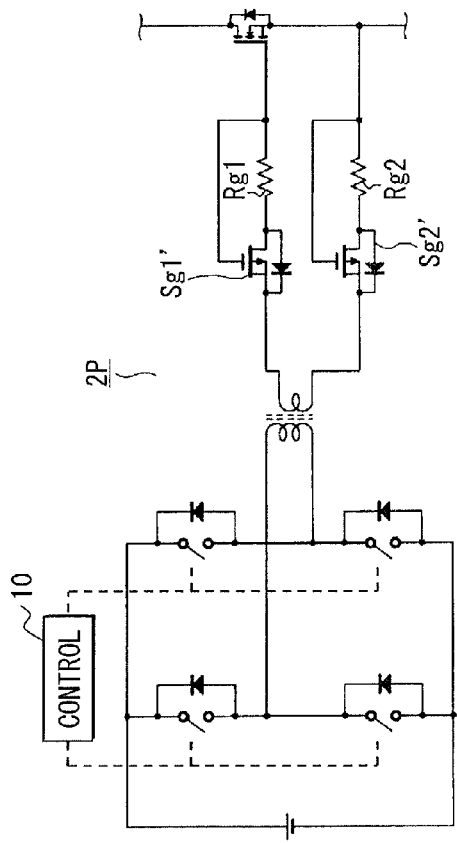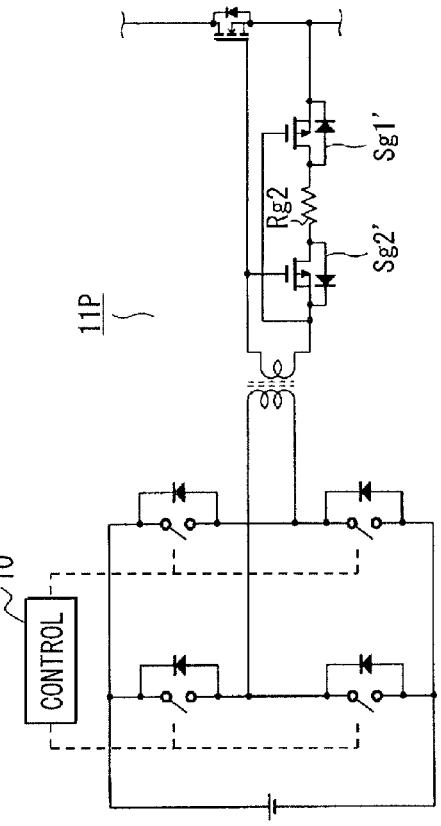
FIG. 9A
FIG. 9B

SEMICONDUCTOR SWITCHING DEVICE DRIVE CIRCUIT USING A LIMITED DRIVE VOLTAGE

CROSS REFERENCE TO RELATED APPLICATION

This application is based on Japanese Patent Application No. 2011-29733 filed on Feb. 15, 2011, the disclosure of which is incorporated herein by reference.

TECHNICAL FIELD

The present disclosure relates to a drive circuit for driving a drive-target switching device having a control terminal applied with a limited drive voltage.

BACKGROUND

For example, a bridge circuit such as an inverter includes multiple power devices (semiconductor switching devices) such as power MOSFET and IGBT. These power devices, when driven, indicate different source potentials at high and low sides. A gate drive circuit corresponding to either side needs to be isolated. Generally, a photo-coupler may be provided for a signal line to electrically insulate the signal line. The power supply for the gate drive circuit is provided as a floating power supply to isolate the gate drive circuit.

A pulse transformer may be used for a gate drive circuit to isolate a gate signal from the drive circuit at a time. As disclosed in JP-A-2004-194450 (see FIG. 1), for example, two gate drive power supplies and zener diodes are used to provide the configuration capable of implementing a PWM control (positive/negative asymmetric signal control) that is unavailable to ordinary configurations using pulse transformers.

Power switching devices such as power MOSFETs are requested to be controlled so as to be normally off in order to ensure safety during operation. Compared to silicon MOSFETs, next-generation devices such as an SiC (silicon carbide)-J (junction) FET and a GaN (gallium nitride) FET can greatly reduce losses and enable normally-off operation. However, many of these FETs apply just several voltages (approximately 2 V to 3 V) while an Si power MOSFET can apply a voltage of 10 V to 20 V to the gate. Such devices cannot be driven at a high voltage and therefore make high-speed switching difficult.

JP-A-2004-194450 is hardly applicable to the configuration of a bridge circuit using the above-described power devices. This is because a zener voltage of the zener diode regulates the secondary voltage of the pulse transformer, putting limitations on decrease in the gate voltage. In addition, two gate drive power supplies are needed for the primary side of the pulse transformer, requiring more costs than ordinary drive circuits.

SUMMARY

It is an object of the present disclosure to provide a semiconductor switching device drive circuit enabling fast switching and isolation for a switching device setting a limitation on application of drive voltage.

According to an aspect, a semiconductor switching device drive circuit comprises a drive power supply configured to supply a direct current power to drive a drive-target switching device being voltage-driven. The semiconductor switching device drive circuit further comprises an alternating current generation unit configured to generate an alternating current with the drive power supply. The semiconductor switching device drive circuit further comprises a transformer having a primary winding supplied with the alternating current and a secondary winding configured to form a current path connecting a potential reference output terminal of the drive-target switching device with a control terminal of the drive-target switching device. The semiconductor switching device drive circuit further comprises first and second switching devices being voltage-driven and inserted oppositely to each other in the current path. The first and second switching devices are respectively connected in parallel with diodes, which are opposite to each other. A control terminal of the first switching device and a control terminal of the second switching device are respectively connected to one end of the secondary winding and the other end of the secondary winding. The first switching device is configured to change in a conduction state as a voltage applied to the control terminal of the first switching device varies over a threshold value while an alternating-current voltage generated at the secondary winding is in one polarity. The second switching device is configured to change in a conduction state as a voltage applied to the control terminal of the second switching device varies over a threshold value while the alternating-current voltage generated at the secondary winding is in the other polarity. In response that one of the first and second switching devices turns on to flow a current along the current path to turn on the drive-target switching device, a voltage changes between the control terminal of the drive-target switching device and the potential reference output terminal of the drive-target switching device to turn off the one of the first and second switching devices being turned on, thereby to clamp a potential of the control terminal of the drive-target switching device.

BRIEF DESCRIPTION OF THE DRAWINGS

The above and other objects, features and advantages of the present disclosure will become more apparent from the following detailed description made with reference to the accompanying drawings. In the drawings:

FIG. 7 is a view showing a current path for turn-on operation;

FIG. 8 is a view showing a current path for turn-off operation; and

FIGS. 9A and 9B are diagrams showing electric configurations of drive circuits according to a third embodiment.

DETAILED DESCRIPTION (First Embodiment)

Figure 1:
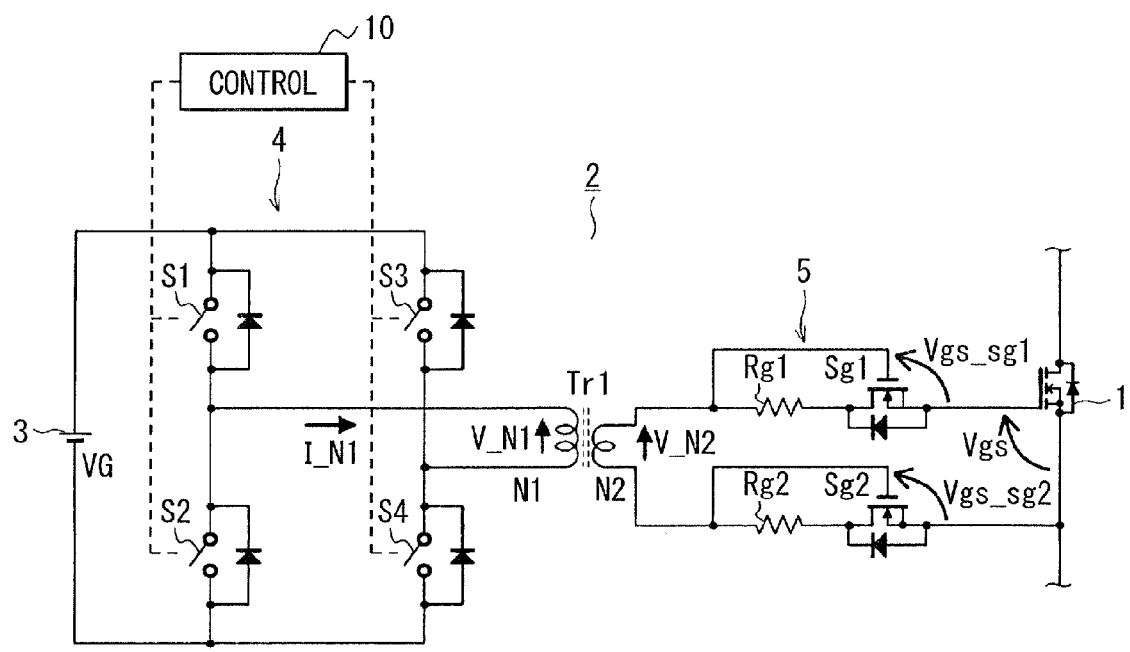
FIG. 1 is a diagram showing an electric configuration of a drive circuit according to a first embodiment.

The following describes the first embodiment with reference to FIGS. 1 through 4. FIG. 1 shows a drive circuit that drives an N-channel FET, for example. In the drawing, an N-channel FET 1 is represented with an MOSFET symbol for convenience sake though the FET is not limited to the MOS structure. The N-channel FET 1 (drive-target switching device) is provided for the high side (upper arm) of a bridge circuit such as an inverter circuit, for example. A drive circuit 2 is connected between the gate and the source of the N-channel FET 1. The drive circuit 2 applies a drive voltage between a gate (control terminal) and a source (potential reference output terminal) of the N-channel FET 1 as an N-channel MOSFET and supplies a charge-discharge current to the gate based on power supply voltage VG supplied from a gate drive power supply 3. A parallel circuit using switch and diode symbols shown in FIG. 1 actually provides an N-channel MOSFET (using a parasitic diode). These symbols are used for ease of description.

The gate drive power supply 3 is parallel connected to a series circuit of switches S1 and S2 (energization switching devices) and a series circuit of switches S3 and S4 (energization switching devices). These series circuits configure an H-bridge circuit (alternating current generation unit) 4. Primary winding N1 of transformer Tr1 is connected between a common connection point of the switches S1 and S2 and a common connection point of the switches S3 and S4. A control circuit 10 controls operations of the switches S1 through S4.

One end of secondary winding N2 of the transformer Tr1 is connected to the gate of the N-channel FET 1 through a resistance device Rg1 and the drain-source of an N-channel MOSFET_Sg1 (first switching device). The gate of the N-channel MOSFET_Sg1 is connected to the one end of the secondary winding N2. The other end of the secondary winding N2 is connected to the source of the N-channel FET 1 through a resistance device Rg2 and the drain-source of an N-channel MOSFET_Sg2 (second switching device). The gate of the N-channel MOSFET_Sg2 is connected to the other end of the secondary winding N2. At the secondary winding N2, a current path 5 is formed between the gate and the source of the N-channel FET 1 through the resistance device Rg1, the N-channel MOSFET_Sg1, the resistance device Rg2, and the N-channel MOSFET_Sg2. The primary winding N1 and the secondary winding N2 of the transformer Tr1 are coupled in the same phase.

Figure 2:
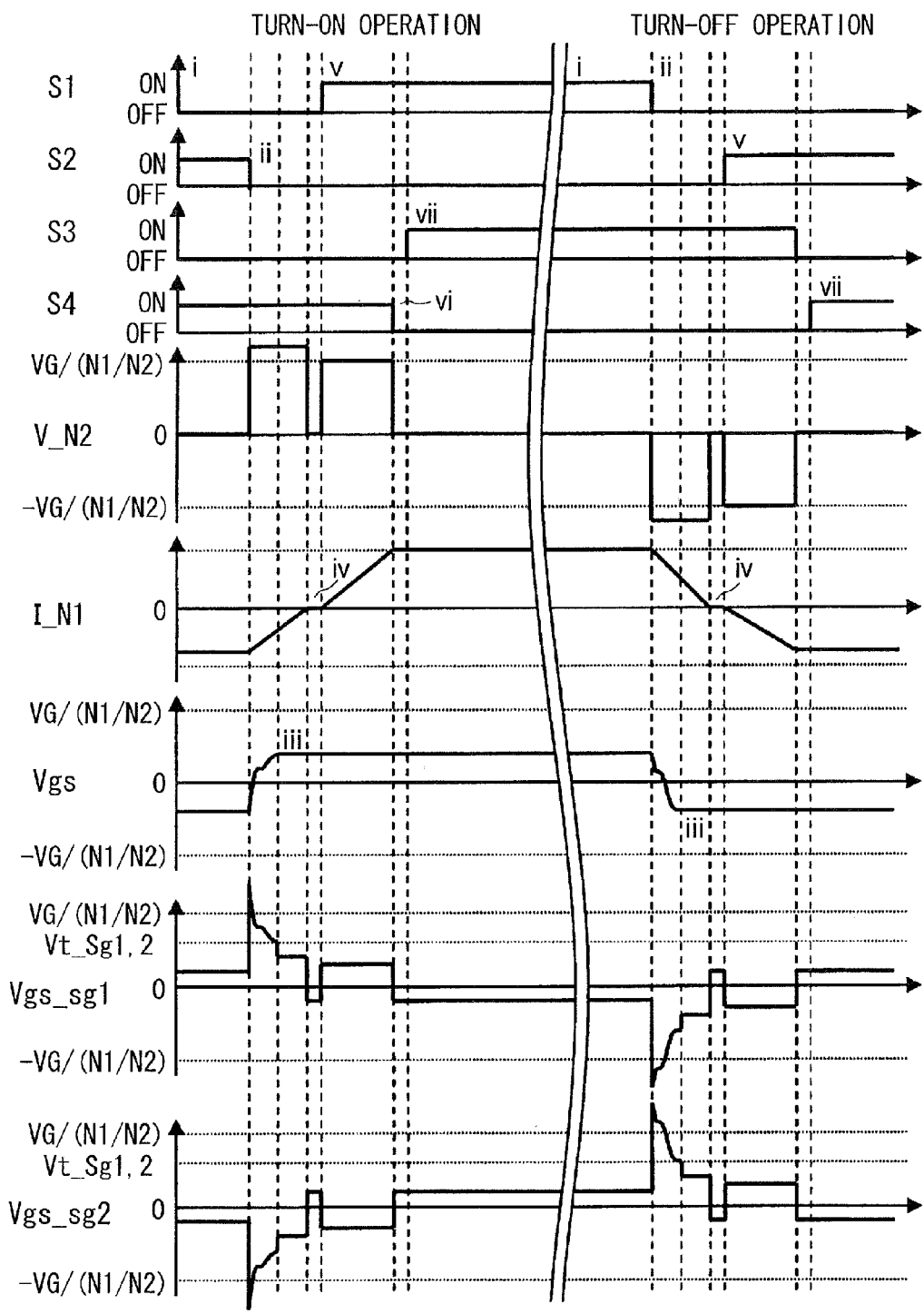
FIG. 2 is a timing chart showing signals showing drive circuit operations.
Figure 3:
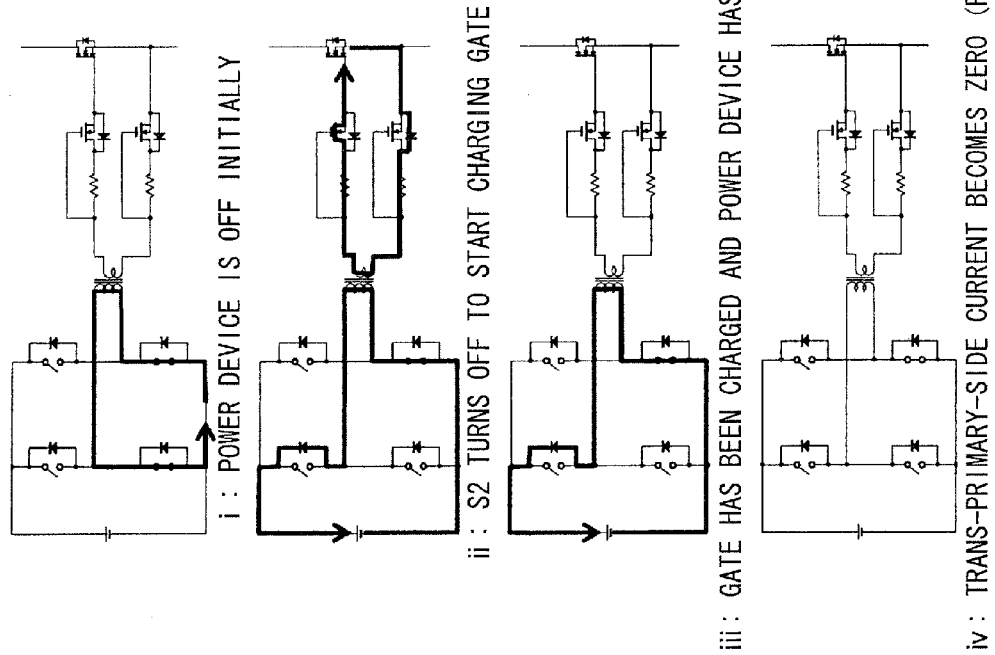
FIG. 3 is a view showing a current path for turn-on operation.
Figure 4:
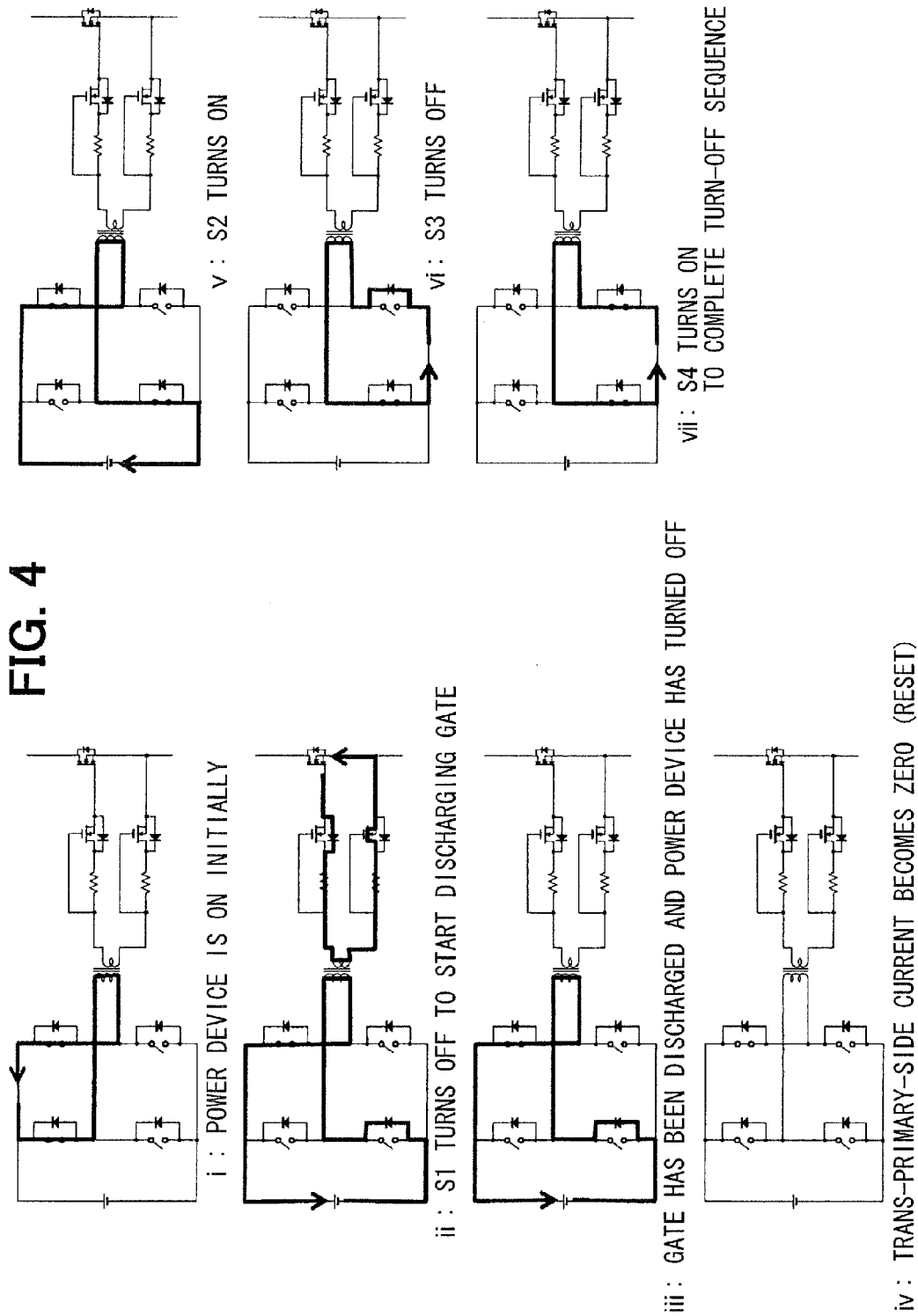
FIG. 4 is a view showing a current path for turn-off operation.
Figure 5:
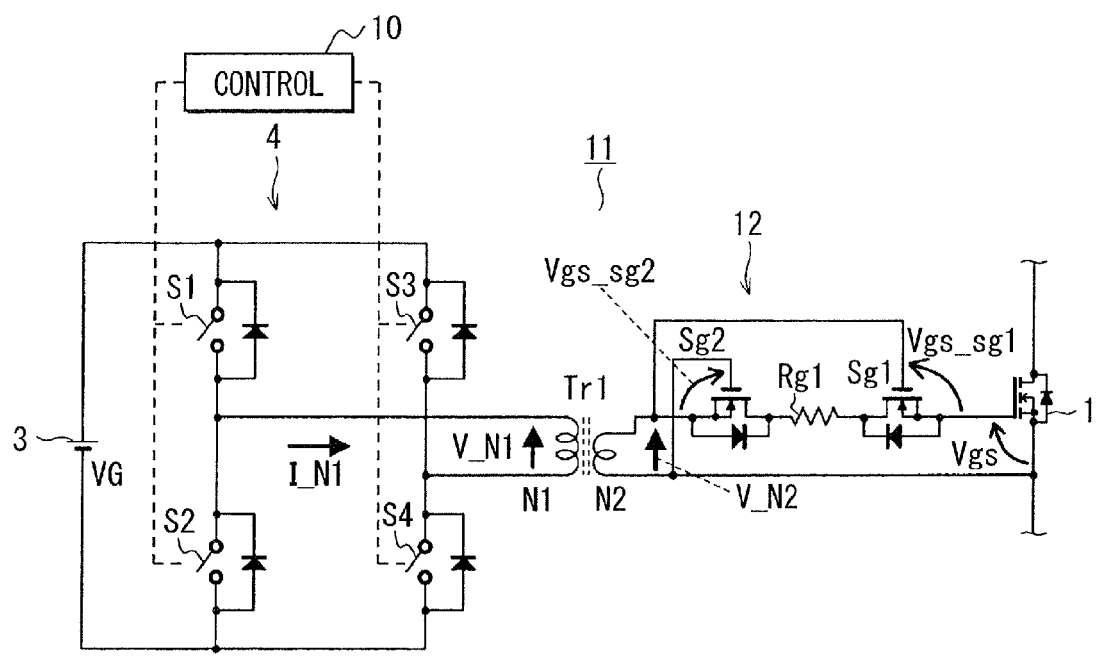
FIG. 5 is a diagram showing an electric configuration of a drive circuit according to a second embodiment.

The following describes operations of the embodiment with reference to FIGS. 2 through 4. FIG. 2 is a timing chart showing on/off operations performed by the control circuit 10 for the switches S1 through S4, and voltage and current waveforms of the components. FIG. 3 shows a sequence of selecting the switches S1 through S4 in order to turn on the N-channel FET 1 and corresponding flows of a current.

Turning on the N-channel FET 1

In the following description, parenthesized Roman numerals (1)-(7) denote Greek numerals i-vii in FIGS. 2 through 4. (1) As an initial state in FIG. 3, the switches S2 and S4 turn on. Current I_N1 flows in a negative direction through the primary winding N1 of the transformer Tr1. The N-channel FET 1 turns off. Gate-source voltage Vgs for the N-channel MOSFET is set to a negative potential. (2) The switch S2 turns off to flow primary current I_N1 through a path of the primary winding N1, a diode of the switch S1, the gate drive power supply 3, the switch S4, and the primary winding N1. This current change induces the following voltage to the secondary winding N2.

$$V\_N2 = (VG+Vf)/(N1/N2) \qquad (1)$$

This voltage is found by adding forward voltage Vf of the diode to the power supply voltage VG so as to correspond to a turn ratio (N1/N2) of the transformer Tr.

Given that the N-channel MOSFET_Sg1 and MOSFET_Sg2 are respectively supplied with gate-source voltages Vgs_sg1 and Vgs_sg2, the secondary winding N2 is supplied with the voltage V_N2 as follows.

$$V\_N2 = Vgs + Vgs\_sg1 - Vgs\_sg2 \qquad (2)$$

The voltage V_N2 increases and the gate-source voltage Vgs_sg1 exceeds a threshold value. The N-channel MOSFET_Sg1 then turns on. A current flows into the secondary winding N2 through a parasitic diode of the N-channel MOSFET_Sg2 and charges the gate of the N-channel FET 1.

The gate of the N-channel FET 1 is charged and the gate-source voltage Vgs increases. The gate-source voltage Vgs_sg1 then decreases accordingly. The N-channel MOSFET_Sg1 turns off when the voltage Vgs_sg1 becomes lower than the threshold value. The gate potential of the N-channel FET 1 stops increasing and is clamped. (3) At this point, the gate of the N-channel FET 1 is finally charged. The N-channel FET 1 turns on. (4) Zeroing the current I_N1 also zeros the voltage V_N2 of the secondary winding N2.

(5) The switch S1 turns on. The primary current I_N1 flows through a path of the gate drive power supply 3, the switch S1, the primary winding N1, the switch S4, and the gate drive power supply 3, and reverses its polarity. The current change sets the voltage V_N2 of the secondary winding N2 as follows.

$$V\_N2 = VG/(N1/N2) \qquad (3)$$

(6) The switch S4 turns off. The primary current I_N1 flows through a closed loop of the primary winding N1, the diode of the switch S3, the switch S1, and the primary winding N1. (7) The switch S3 turns on. A current flows through the switch S3 instead of the diode thereof in the above-described path. The N-channel FET 1 turn-on sequence has been completed. The processes (5) through (7) are needed for the subsequent turn-off sequence to be described below.

The voltage VG of the gate drive power supply 3 and the turn ratio (N1/N2) are predetermined so that a maximum voltage occurring at the secondary winding N2 becomes equal to the sum of the gate-source voltage Vgs for turning on the N-channel FET 1, the threshold voltages for the N-channel MOSFET_Sg1 and MOSFET_Sg2, and forward voltage Vf of the diode parallel connected to the N-channel MOSFET_Sg1 and MOSFET_Sg2. Under this condition, equation (1) is equal to equation (2) whose third term on the right-hand side is replaced by "+Vf." The right amount of voltage can be applied.

Turning off the N-channel FET 1

In FIG. 4, (1) the N-channel FET 1 turns off as described above. (2) The switch S1 turns off. The primary current I_N1 flows through a path of the primary winding N1, the switch S3, the gate drive power supply 3, the diode of the switch S2, and the primary winding N1. The current change at this time induces the following voltage to the secondary winding N2.

$$V\_N2 = -(VG+Vf)/(N1/N2) \qquad (4)$$

The gate potential of the N-channel MOSFET_Sg2 increases and the gate-source voltage Vgs_sg2 exceeds a threshold value. The N-channel MOSFET_Sg2 turns on. A current flows into the secondary winding N2 through a parasitic diode of the N-channel MOSFET_Sg1 and discharges the gate of the N-channel FET 1.

The gate of the N-channel FET 1 is discharged and the gate-source voltage Vgs decreases. The gate-source voltage Vgs_sg2 then decreases accordingly. The N-channel MOSFET_Sg2 turns off when the voltage Vgs_sg2 becomes lower than the threshold value. The gate potential of the N-channel FET 1 stops decreasing and is clamped. (3) At this point, the gate of the N-channel FET 1 is finally discharged. The N-channel FET 1 turns off. (4) Zeroing the current I_N1 also zeros the voltage V_N2 of the secondary winding N2.

(5) The switch S2 turns on. The primary current I_N1 flows through a path of the gate drive power supply 3, the switch S3, the primary winding N1, the switch S2, and the gate drive power supply 3, and reverses its polarity. The current change sets the voltage V_N2 of the secondary winding N2 as follows.

$$V\_N2 = -VG/(N1/N2) \quad (5)$$

(6) The switch S3 turns off. The primary current I_N1 flows through a closed loop of the primary winding N1, the switch S2, the diode of the switch S4, and the primary winding N1. (7) The switch S4 turns on. A current flows through the switch S4 instead of the diode thereof in the above-described path. The N-channel FET 1 turn-off sequence has been completed. The processes (5) through (7) are also needed for the subsequent turn-on sequence. As a result, as shown in FIG. 2, the turn-on sequence and the turn-off sequence make operations of the drive circuit 2 symmetrical to each other.

According to the embodiment, the N-channel MOSFET_Sg1 and MOSFET_Sg2 are reversely inserted into the current path 5 containing the N-channel FET 1 toward the secondary winding N2 of the transformer Tr included in the drive circuit 2. The primary winding of the transformer is supplied with an alternating current generated from the H-bridge circuit 4. Alternating-current voltage V_N2 is then induced to the secondary winding N2. The N-channel MOSFET_Sg1 turns on when the alternating-current voltage V_N2 provides one polarity and a voltage applied to its gate (with reference to the source) exceeds the threshold value. A charging current is applied to the gate of the N-channel FET 1 to turn the N-channel FET 1 on. The N-channel MOSFET_Sg2 turns on when the alternating-current voltage V_N2 provides the other polarity and a voltage applied to its gate exceeds a threshold value. A discharging current flows from the gate of the N-channel FET 1 to turn the N-channel FET 1 off.

The voltage V_N2 induced at the secondary side of the transformer Tr1 exclusively turns on the N-channel MOSFET_Sg1 and MOSFET_Sg2. This enables to form the current path that charges or discharges the gate of the N-channel FET 1. When the N-channel FET 1 turns on, its gate potential changes to turn off the N-channel MOSFET_Sg1. With the present configuration, a lower voltage can be utilized to clamp the gate voltage of the N-channel FET 1 without using a zener diode. The transformer Tr1 can isolate the N-channel FET 1 from the drive circuit 2. In addition, the N-channel FET 1 can fast turn on or off while its gate potential is controlled.

In this case, the voltage VG and the turn ratio (N1/N2) are predetermined to determine a maximum voltage occurring at the secondary winding N2 in consideration of the gate-source voltage Vgs for turning on the N-channel FET 1, the threshold voltages for the N-channel MOSFET_Sg1 and MOSFET_Sg2, and the forward voltages Vf of the diodes parallel connected respectively to the N-channel MOSFET_Sg1 and MOSFET_Sg2. More specifically, the voltage VG and the turn ratio (N1/N2) are predetermined so that the maximum voltage occurring at the secondary winding N2 becomes equal to the sum of the gate-source voltage Vgs for turning on the N-channel FET 1, one of the threshold voltages for the N-channel MOSFET_Sg1 and MOSFET_Sg2, and corresponding one of the forward voltages Vf of the diodes parallel connected respectively to the N-channel MOSFET_Sg1 and MOSFET_Sg2. In this way, the right amount of the secondary voltage V_N2 can be applied. The H-bridge circuit 4 can supply the alternating current to the primary winding N1 of the transformer Tr1 because the control circuit 10 controls operations of the switches S1 through S4.

(Second Embodiment)

FIGS. 5 through 8 show the second embodiment. The mutually corresponding elements in the second and first embodiments are designated by the same reference numerals and a detailed description is omitted for simplicity. In the drive circuit 11 according to the second embodiment, the N-channel MOSFET_Sg2 is inserted into a position different from that of the first embodiment at the secondary side of the transformer Tr1. The source of the N-channel MOSFET_Sg2 is connected to the one end of the secondary winding N2. The drain is connected to the resistance device Rg1. That is, the N-channel MOSFET_Sg1 and MOSFET_Sg2 are connected reversely (oppositely) to each other in series via the resistance device Rg1. The resistance device Rg2 is removed to configure a current path 12 at the secondary side.

Figure 6:
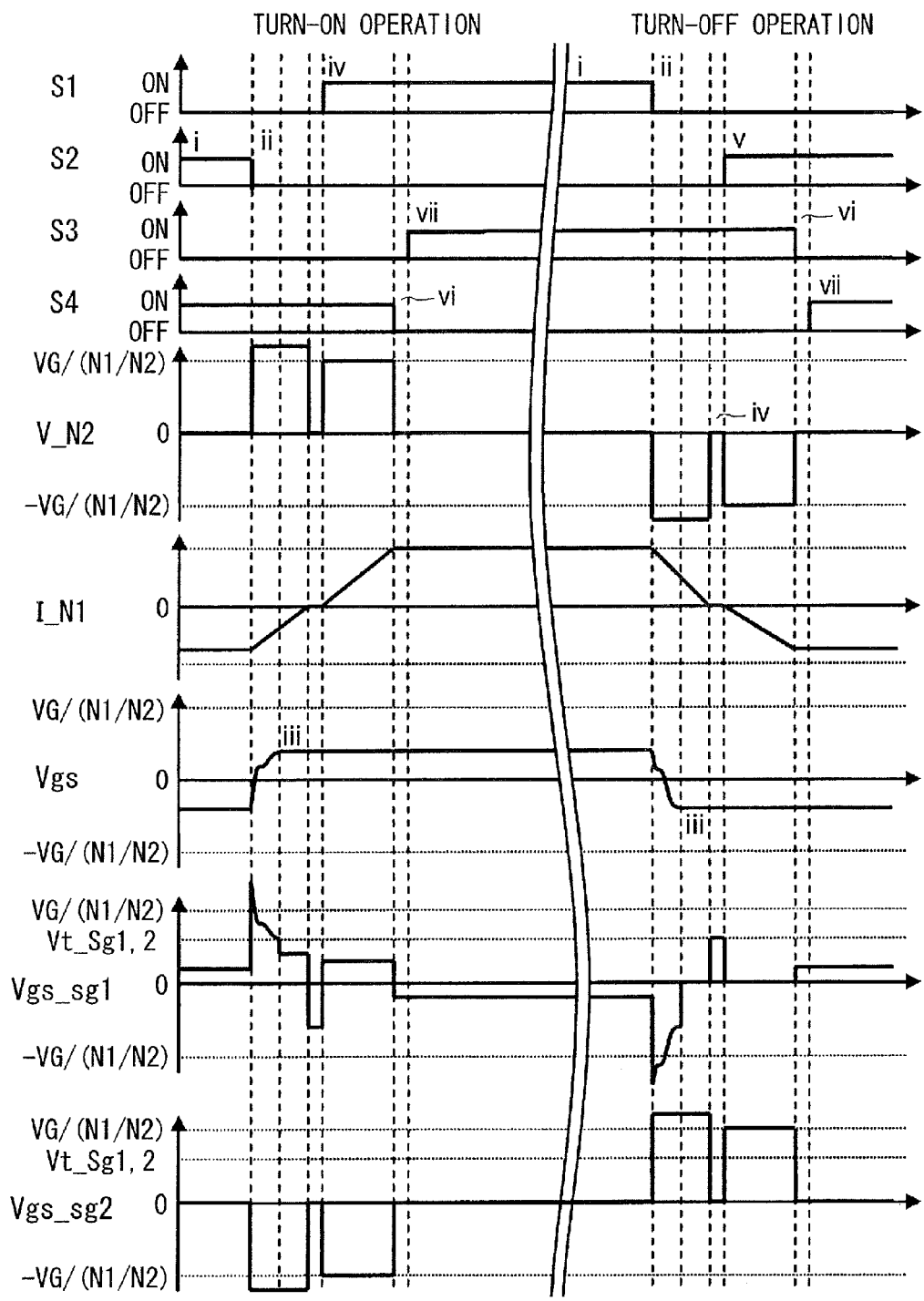
FIG. 6 is a timing chart showing signals showing drive circuit operations.

The following describes operations of the second embodiment. FIGS. 6 through 8 are equivalent to FIGS. 2 through 4 according to the first embodiment. The H-bridge circuit 4 controls the switches S1 through S4 at the same control timings as those described in the first embodiment during the turn-on sequence and the turn-off sequence for the N-channel FET 1. At the secondary side, the N-channel MOSFET_Sg1 accordingly performs the same operations as those of the first embodiment.

A difference from the first embodiment is the gate-source voltage Vgs_sg2 for the N-channel MOSFET_Sg2 shown in FIG. 6. In this case, the gate-source voltage provides a phase reverse to that of the secondary voltage V_N2. As a result, the N-channel MOSFET_Sg2 keeps the on-state during sequences (2), (3), and (5) in FIG. 8. Unlike the first embodiment, the gate-source voltage Vgs is not clamped when the N-channel FET 1 turns off. This causes no problem because the gate voltage need not be controlled when the N-channel FET 1 turns off. The gate-source voltage Vgs_sg2 continues to remain higher and decreases a resistance value in the path for a discharge current. With the present configuration, it is possible to increase a turn-off speed for the reduced resistance.

According to the second embodiment, the N-channel MOSFET_Sg1 and MOSFET_Sg2 are inserted in series between the one end of the secondary winding N2 and the gate of the N-channel FET 1. Also in this case, the N-channel MOSFET_Sg1 and MOSFET_Sg2 turn on alternately in accordance with a change in the alternating-current voltage polarity at the secondary winding N2. This enables to supply a current to charge the gate and to remove a current to discharge the gate. This configuration does not need the resistance device Rg2 and therefore can consume less power on the current path 12 than that of the first embodiment.

(Third Embodiment)

FIGS. 9A and 9B show the third embodiment. The following describes only differences from the first or second embodiment. The third embodiment replaces the N-channel MOSFET_Sg1 and MOSFET_Sg2 with P-channel MOSFET_Sg1' and MOSFET_Sg2' (first and second switching devices). FIG. 9A shows the configuration of a drive circuit 2P equivalent to that of the first embodiment. FIG. 9B shows the configuration of a drive circuit 11P equivalent to that of the second embodiment. Sources of the P-channel MOSFET_Sg1' and MOSFET_Sg2' are connected respectively to the one end and the other end of the secondary winding N2. Drains of the P-channel MOSFET_Sg1' and MOSFET_Sg2' are connected to their gates and respectively to the gate and the source of the N-channel FET 1 via the resistance devices Rg1 and Rg2.

During the turn-on operation (2) shown in FIG. 2, the source potential of the P-channel MOSFET_Sg1' increases and Vgs_sg1' becomes lower than a threshold value. The P-channel MOSFET_Sg1' then turns on to charge the gate of the N-channel FET 1 and turn on the N-channel FET 1. During the turn-off operation (2) shown in FIG. 2, the source potential of the P-channel MOSFET_Sg2' increases and Vgs_sg2' becomes lower than a threshold value. The P-channel MOSFET_Sg2' then turns on to discharge the gate of the N-channel FET 1 and turn off the N-channel FET 1.

According to the drive circuit 11P shown in FIG. 9B, the P-channel MOSFET_Sg1' is directly connected to the P-channel MOSFET_Sg2'. The drain of the P-channel MOSFET_Sg1' is connected to the resistance device Rg2 and the source of the P-channel MOSFET_Sg1' is connected to the source of the N-channel FET 1. The gate of the P-channel MOSFET_Sg1' is connected to the one end (to the side where the source of the P-channel MOSFET_Sg2' is connected) of the secondary winding N2. The gate of the P-channel MOSFET_Sg2' is connected to the other end of the secondary winding N2.

During the turn-on operation (2) shown in FIG. 6, the gate potential of the P-channel MOSFET_Sg1' decreases and Vgs_sg1' becomes lower than a threshold value. The P-channel MOSFET_Sg1' then turns on to charge the gate of the N-channel FET 1 and turn on the N-channel FET 1. During the turn-off operation (2) shown in FIG. 6, the gate potential of the P-channel MOSFET_Sg2' decreases and Vgs_sg2' becomes lower than a threshold value. The P-channel MOSFET_Sg2' then turns on to discharge the gate of the N-channel FET 1 and turn off the N-channel FET 1.

As described above, the third embodiment configures the first and second switching devices using the P-channel MOSFET_Sg1 and MOSFET_Sg2 and provides the same effect as the first and second embodiments.

The present invention is not limited to the above-described embodiments and the accompanying drawings but may be modified or enhanced as follows.

The diodes are parallel connected to the switching devices S1 through S4 but may be unneeded.

The alternating current generation unit is not limited to an H-bridge circuit and may be configured to be capable of supplying an alternating current to the primary winding N1 of the transformer Tr1.

The drive-target switching device may represent MOSFET, MISFET, JFET, or HEMT (High Electron Mobility Transistor).

The drive-target switching device may or may not be provided at the high side of an inverter circuit. The drive-target switching device is connected between a high potential point and a low potential point in a bridge circuit. In addition, the drive-target switching device is applicable if it needs to be insulated from the drive circuit.

Summarizing the above examples, a semiconductor switching device drive circuit includes first and second switching devices that are inserted reversely to each other into a current path including a drive-target switching device toward a secondary winding of a transformer. A primary winding of the transformer is supplied with an alternating current generated from an alternating current generation unit. An alternating-current voltage is induced at the secondary winding. The first switching device changes a conduction state according as a voltage applied to a control terminal of the first switching device varies over a threshold value while the alternating-current voltage is generated as one polarity. The second switching device changes a conduction state according as a voltage applied to a control terminal of the second switching device varies over a threshold value while the alternating-current voltage is generated as the other polarity.

When the first switching device turns on, a current flows to the current path at the secondary winding via a diode parallel connected to the second switching device. When the second switching device turns on, a current flows to the current path via a diode parallel connected to the first switching device. When one of the first and second switching devices turns on, a current flows in a direction to charge a control terminal (hereafter referred to as a drive control terminal) of the drive-target switching device. When the other of the first and second switching devices turns on, a current flows in a direction to discharge the drive control terminal. When one of the first and second switching devices turns on, a current flows through the current path in a direction to turn on the drive-target switching device. Thereby, a voltage between the drive control terminal and a potential reference output terminal changes. Thereby, the first or second switching device, whichever is turned on, then turns off to clamp the potential at the drive control terminal. The "potential reference output terminal" signifies an output terminal (e.g., the source of MOSFET) used as the potential reference for a voltage that is applied to the control terminal to turn on the voltage-driven switching device.

A voltage induced at the secondary side of the transformer exclusively can turn on the first and second switching devices to form a current path that charges or discharges the drive control terminal. When the drive-target switching device turns on, the potential of the drive control terminal changes to turn off the first or second switching device, whichever is turned on. Thus, a lower voltage can be utilized to clamp the potential of drive control terminal without using a zener diode as described in JP-A-2004-194450.

In the semiconductor switching device drive circuit, a voltage of the drive power supply and a turn ratio of the transformer may be predetermined so that a maximum voltage generated at the secondary winding is the sum of a turn-on voltage applied between a drive control terminal and a potential reference output terminal, the threshold voltage of the first and second switching devices, and the forward voltage of the diodes parallel connected to the first and second switching devices. While the first or second switching device is turned on, it is possible to adjust and supply a specified voltage for the drive control terminal that turns on the drive-target switching device.

In the semiconductor switching device drive circuit, the first switching device may be inserted between the one end of the secondary winding and the drive control terminal. The second switching device may be inserted between the other end of the secondary winding and the potential reference output terminal of the drive-target switching device. The first and second switching devices turn on alternately due to a change in the voltage between the control terminal and the potential reference output terminal of the switching devices in accordance with a change in the alternating-current voltage polarity at the secondary winding. This enables to apply a current to charge the drive control terminal and a current to discharge the drive control terminal.

In the semiconductor switching device drive circuit, the first and the second switching devices each may include an N-channel MOSFET. The first switching device turns on to charge the drive control terminal if gate-source voltage Vgs of the first switching device exceeds a threshold voltage during a period in which a voltage output from the secondary winding provides one polarity. The charge increases a voltage between the drive control terminal and the potential reference output terminal. The gate-source voltage Vgs accordingly decreases to turn off the first switching device and to stop the charge.

The second switching device turns on to discharge the drive control terminal if gate-source voltage Vgs of the second switching device exceeds a threshold voltage during a period in which a voltage output from the secondary winding provides the other polarity. The discharge decreases a voltage between the drive control terminal and the potential reference output terminal. The gate-source voltage Vgs accordingly decreases to turn off the second switching device and to stop the discharge. Therefore, the voltage can be clamped regardless of whether the charge or the discharge increases the potential of the drive control terminal.

In the semiconductor switching device drive circuit, the first and the second switching device each may include a P-channel MOSFET. The second switching device turns on to charge the drive control terminal during a period in which a voltage output from the secondary winding provides one polarity. The first switching device turns on to discharge the drive control terminal during a period in which a voltage output from the secondary winding provides the other polarity. Therefore, the same effect is available.

In the semiconductor switching device drive circuit, the first and second switching devices may be inserted in series between the one end of the secondary winding and the drive control terminal. Also in this case, the first and second switching devices alternately turn on in accordance with a change in the alternating-current voltage polarity at the secondary winding. This enables to apply a current to charge the drive control terminal and a current to discharge the drive control terminal.

In the semiconductor switching device drive circuit, the first and the second switching devices each may include an N-channel MOSFET. The effect of the first switching device is the same as that described above. Gate-source voltage Vgs for the second switching device becomes reverse to a voltage generated at the secondary winding. Consequently, a high voltage is continuously applied between the gate and the source of the second switching device. The resistance component for discharging the drive control terminal becomes smaller than that described above. The drive-target switching device accordingly increases a switching speed. Only one resistance device can be used to configure a current path.

In the semiconductor switching device drive circuit, the first and the second switching devices each may include a P-channel MOSFET. Also in this case, the second switching device turns on to charge the drive control terminal during a period in which a voltage output from the secondary winding provides one polarity. The first switching device turns on to discharge the drive control terminal during a period in which a voltage output from the secondary winding provides the other polarity. Therefore, the same effect as that described above is available.

In the semiconductor switching device drive circuit, the alternating current generation unit may include an H-bridge circuit having four switching devices and a control circuit that controls operations of the four switching devices. With the present configuration, the primary winding of the transformer can generate an alternating current through the H-bridge circuit.

It should be appreciated that while the processes of the embodiments of the present invention have been described herein as including a specific sequence of steps, further alternative embodiments including various other sequences of these steps and/or additional steps not disclosed herein are intended to be within the steps of the present invention.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. A semiconductor switching device drive circuit comprising:
   a drive power supply configured to supply a direct current power to drive a drive-target switching device being voltage-driven;
   an alternating current generation unit configured to generate an alternating current with the drive power supply;
   a transformer having a primary winding supplied with the alternating current and a secondary winding configured to form a current path connecting a potential reference output terminal of the drive-target switching device with a control terminal of the drive-target switching device; and
   first and second switching devices being voltage-driven and inserted oppositely to each other in the current path,
   wherein the first and second switching devices are respectively connected in parallel with diodes, which are opposite to each other,
   wherein a control terminal of the first switching device and a control terminal of the second switching device are respectively connected to one end of the secondary winding and the other end of the secondary winding,
   wherein the first switching device is configured to change in a conduction state as a voltage applied to the control terminal of the first switching device varies over a threshold voltage value while an alternating-current voltage generated at the secondary winding is in one polarity,
   wherein the second switching device is configured to change in a conduction state as a voltage applied to the control terminal of the second switching device varies over a threshold voltage value while the alternating-current voltage generated at the secondary winding is in the other polarity, and
   wherein, in response that one of the first and second switching devices turns on to flow a current along the current path to turn on the drive-target switching device,
      a voltage changes between the control terminal of the drive-target switching device and the potential reference output terminal of the drive-target switching device to turn off the one of the first and second switching devices being turned on,
      thereby to clamp a potential of the control terminal of the drive-target switching device,
   wherein a voltage of the drive power supply and a turn ratio of the transformer are predetermined so that a maximum voltage generated at the secondary winding is a sum of:
      a turn-on voltage applied between the control terminal of the drive-target switching device and the potential reference output terminal of the drive-target switching device;
      the threshold voltage value of the first and second switching devices; and
      a forward voltage of the diodes connected in parallel with the first and second switching devices.

2. The semiconductor switching device drive circuit according to claim 1,
wherein the first switching device is inserted between the one end of the secondary winding and the control terminal of the drive-target switching device, and
wherein the second switching device is inserted between the other end of the secondary winding and the potential reference output terminal of the drive-target switching device.

3. The semiconductor switching device drive circuit according to claim 2,
wherein each of the first and the second switching devices includes an N-channel MOSFET,
wherein the first switching device has:
a gate connected to the one end of the secondary winding;
a source connected to the control terminal of the drive-target switching device; and
a drain connected to one end of the secondary winding via a resistance device, and
wherein the second switching device has:
a gate connected to the other end of the secondary winding;
a source connected to the potential reference output terminal of the drive-target switching device; and
a drain connected to the other end of the secondary winding via a resistance device.

4. The semiconductor switching device drive circuit according to claim 2,
wherein each of the first and the second switching devices includes a P-channel MOSFET,
wherein the first switching device has:
a gate connected to the control terminal of the drive-target switching device;
a drain connected to the control terminal of the drive-target switching device via a resistance device; and
a source connected to the one end of the secondary winding, and
wherein the second switching device has:
a gate connected to the potential reference output terminal of the drive-target switching device;
a drain connected to the potential reference output terminal via a resistance device; and
a source connected to the other end of the secondary winding.

5. The semiconductor switching device drive circuit according to claim 1,
wherein the alternating current generation unit includes an H-bridge circuit having four switching devices and a control circuit configured to control operations of the four switching devices.

6. A semiconductor switching device drive circuit comprising:
a drive power supply configured to supply a direct current power to drive a drive-target switching device being voltage-driven;
an alternating current generation unit configured to generate an alternating current with the drive power supply;
a transformer having a primary winding supplied with the alternating current and a secondary winding configured to form a current path connecting a potential reference output terminal of the drive-target switching device with a control terminal of the drive-target switching device; and
first and second switching devices being voltage-driven and inserted oppositely to each other in the current path,
wherein the first and second switching devices are respectively connected in parallel with diodes, which are opposite to each other,
wherein a control terminal of the first switching device and a control terminal of the second switching device are respectively connected to one end of the secondary winding and the other end of the secondary winding,
wherein the first switching device is configured to change in a conduction state as a voltage applied to the control terminal of the first switching device varies over a threshold voltage value while an alternating-current voltage generated at the secondary winding is in one polarity,
wherein the second switching device is configured to change in a conduction state as a voltage applied to the control terminal of the second switching device varies over a threshold voltage value while the alternating-current voltage generated at the secondary winding is in the other polarity,
wherein, in response that one of the first and second switching devices turns on to flow a current along the current path to turn on the drive-target switching device,
a voltage changes between the control terminal of the drive-target switching device and the potential reference output terminal of the drive-target switching device to turn off the one of the first and second switching devices being turned on,
thereby to clamp a potential of the control terminal of the drive-target switching device, and
wherein the first and second switching devices are inserted in series between the one end of the secondary winding and the control terminal of the drive-target switching device.

7. The semiconductor switching device drive circuit according to claim 6,
wherein each of the first and the second switching devices includes an N-channel MOSFET;
wherein the first switching device has:
a source connected to the control terminal of the drive-target switching device; and
a gate connected to the one end of the secondary winding,
wherein the second switching device has:
a source connected to the one end of the secondary winding; and
a gate connected to the other end of the secondary winding, and
wherein drains of the first and second switching devices are connected to each other via a resistance device.

8. The semiconductor switching device drive circuit according to claim 6,
wherein each of the first and second switching devices includes a P-channel MOSFET;
wherein the first switching device has:
a source connected to an output terminal of the drive-target switching device; and
a gate connected to the one end of the secondary winding,
wherein the second switching device has:
a source connected to the one end of the secondary winding; and
a gate connected to the other end of the secondary winding, and
wherein drains of the first and second switching devices are connected to each other via a resistance device.

* * * * *